United States Patent [19]

Wittkower

[11] Patent Number: 5,196,355
[45] Date of Patent: * Mar. 23, 1993

[54] SIMOX MATERIALS THROUGH ENERGY VARIATION

[75] Inventor: Andrew B. Wittkower, Rockport, Mass.

[73] Assignee: IBIS Technology Corporation, Danvers, Mass.

[*] Notice: The portion of the term of this patent subsequent to Jan. 14, 2009 has been disclaimed.

[21] Appl. No.: 627,265

[22] Filed: Dec. 14, 1990

Related U.S. Application Data

[63] Continuation-in-part of Ser. No. 342,484, Apr. 24, 1989, Pat. No. 5,080,730.

[51] Int. Cl.$^5$ ............................................. H01L 21/265
[52] U.S. Cl. .................................... 437/24; 437/26; 437/62
[58] Field of Search .................. 437/24, 26, 61, 62; 148/33, DIG. 158

[56] References Cited

U.S. PATENT DOCUMENTS

| 4,509,990 | 4/1985 | Vasudev | 437/24 |
|---|---|---|---|
| 4,749,660 | 6/1988 | Short et al. | 437/24 |
| 4,804,633 | 2/1989 | Macelwee et al. | 437/24 |
| 4,863,878 | 9/1989 | Hite et al. | 437/26 |
| 4,975,126 | 12/1990 | Margail et al. | 437/24 |
| 5,080,730 | 1/1992 | Wittkower | 437/26 |

FOREIGN PATENT DOCUMENTS

| 0298794 | 1/1989 | European Pat. Off. . | |
| 53-31971 | 3/1978 | Japan | 437/61 |

OTHER PUBLICATIONS

Hemment et al., *Nuclear Instruments and Methods in Physical Research*, vol. B39, pp. 210–214 (1989), Nucleation and Growth . . . .

Ghandhi, "VLSI Fabrication Principles", John Wiley & Sons, Inc., 1983, pp. 346–348.

*Primary Examiner*—Olik Chaudhuri
*Assistant Examiner*—Ourmazd S. Ojan
*Attorney, Agent, or Firm*—Thomas J. Engellenner

[57] ABSTRACT

A method of manufacturing SIMOX heterostructures using a single implant sequence and an increasing range of ion beam energies is disclosed. The method produces SIMOX materials having thin, continuous buried oxide layers having sharp interfaces and which are substantially free of silicon islands.

8 Claims, 1 Drawing Sheet

SIMOX MATERIALS THROUGH ENERGY VARIATION

REFERENCE TO RELATED APPLICATIONS

This application is a continuation-in-part of co-pending U.S. patent application No. 342,484, now U.S. Pat. No. 5,080,730, entitled "Implantation Profile Control With Surface Sputtering", filed Apr. 24, 1989.

BACKGROUND OF THE INVENTION

The technical field of this invention is the implantation of ions into targets, such as silicon semiconductors, and, in particular, to improved methods for generating a silicon heterostructure having a discrete, continuous, buried dielectric layer which is substantially free of defects.

Ion implantation techniques are particularly useful in forming a class of buried layer devices known as silicon-on-insulator (SOI) devices. In these devices, a buried insulation layer is formed beneath a thin surface silicon film. These devices have a number of potential advantages over conventional silicon devices (e.g., higher speed performance, higher temperature performance and increased radiation hardness).

In one known technique, known by the acronym SIMOX, a very thin (0.1 micron–0.3 micron) layer of monocrystalline silicon is separated from the bulk of the silicon wafer by implanting a high dose of oxygen ions (e.g., up to about $3.0 \times 10^{18}$ oxygen ions/cm$^2$) into the wafer to form a buried dielectric layer of silicon dioxide (having a typical thickness ranging from about 0.1 micron to 0.5 micron). This technique of "separation by implanted oxygen" (SIMOX), provides a heterostructure in which a buried silicon dioxide layer serves as a highly effective insulator for surface layer electronic devices.

While SIMOX technology is proving to be one of the most promising of the SOI technologies, there are a number of problems still associated with the manufacturing of SIMOX materials, as practiced in the art. One particular problem is the presence of isolated pockets of silicon within the buried dielectric layer. These silicon inclusions or "islands" tend to form near the lower interface of the buried layer with the underlying bulk silicon region and can severely affect the performance of SIMOX devices, particularly as MOS devices, by acting as overlapping floating gates. Once formed, the silicon islands are difficult to eliminate, primarily because of silicon's slow diffusion rate, relative to that of oxygen.

Implanting lower doses of oxygen ions appears to exacerbate silicon island formation, particularly as the dose approaches the critical implant dose (the minimum implant dose required to produce a continuous amorphous layer of implanted oxygen, e.g., $1.4 \times 10^{18}$ ions/cm$^2$). However, increasing the implant dose alone does not appear to be sufficient to prevent silicon island formation, although it may reduce the number formed. In addition, higher implant doses require longer implantation times, and increase the damage to the overlying silicon body.

U.S. Pat. No. 4,749,660 (Short et al., filed Nov. 26, 1986), discloses a method of manufacturing SIMOX material having "substantially homogeneous, relatively thin buried silicon dioxide layers". The method comprises implanting a subcritical dose of oxygen ions, followed by at least one "randomizing implant" (e.g., of silicon ions) and then annealing at a low temperature. The effectiveness of this method is unknown, as no experimental evidence is provided.

EPO 298,794 (Margail, J. et al, filed Jun. 13, 1988), discloses a method of manufacturing SIMOX heterostructures having sharp interfaces, using a multiple implant protocol. The method involves implanting a total dose of at least $1.5 \times 10^{18}$ ions/cm$^2$ in a series of multiple partial implants using a constant beam energy and subjecting the wafer to a high temperature annealing protocol between each partial implant. The intermediate annealing steps are thought to reduce the buildup of threading dislocations in the overlying silicon.

There exists a need for a method of manufacturing SIMOX materials having a buried insulating layer substantially free of silicon islands, and that is rapid and cost efficient to produce. It is therefore an object of this invention to provide an improved method of manufacturing SIMOX materials having these characteristics and requiring only a single implant and anneal sequence. Another object of the invention is to provide a method of manufacturing SIMOX materials requiring a lower dose of oxygen ions. Other features and objects of this invention will be apparent from the description, figures and claims which follow.

As used herein, "overlying silicon body" is understood to mean that portion of the silicon wafer (substrate) lying over the buried oxide layer, and on which the semiconductor device is to be built. "Bulk silicon region" is understood to mean that portion of the silicon wafer (substrate) lying below the buried oxide layer. "Upper interface" and "lower interface", respectively, refer to the boundaries separating the buried oxide layer from the overlying silicon body and the underlying bulk silicon region. "Silicon islands" and "silicon inclusions" are understood to mean isolated pockets of silicon within the amorphous dielectric layer. "Substantially free of silicon islands" is understood to mean a buried oxide layer sufficiently depleted of silicon islands such that the performance of the insulating layer or the overlying device is not affected.

SUMMARY OF THE INVENTION

It has now been discovered that a single implant sequence, using an increasing range of ion beam energies and annealed at an appropriate temperature, yields a SIMOX heterostructure having a buried, insulating dielectric layer that is substantially free of silicon islands.

The method of this invention involves a single implant sequence wherein the ion beam energy is increased throughout the implant step. The ion beam energy may be increased in a single continuous sequence, or it may be increased in a number of separate, discrete steps. The implantation time at each beam energy may be constant, or it may vary. Similarly, the ion beam dose at each energy level may be held constant, or it too may be varied. In a currently preferred embodiment of the invention, the dose implanted at each energy level is a constant, subcritical dose.

In the method of this invention, the total dose of oxygen ions implanted may be within the range of about $0.5 \times 10^{18}$ to $3.0 \times 10^{18}$ ions/cm$^2$. Currently preferred implanted doses are within the range of about 0.8 to $1.8 \times 10^{18}$ ions cm$^2$, most preferably about $1.5 \times 10^{18}$ ions/cm$^2$. Lower doses totaling less than $10^{18}$ ions/cm$^2$ also may be implanted, provided that a sufficient dose of ions is implanted at an appropriate depth to produce a continuous amorphous layer.

In one embodiment of the invention, the beam energy can be increased during the process from about 100 keV to about 400 keV. The energy levels chosen will depend on the desired characteristics of the device. In general, the greater the energy of the implanted ions, the deeper the buried ion layer will be. Oxygen ions implanted at an energy level in the range of 150 keV to 200 keV generally yield a buried $SiO_2$ layer of about 0.1–0.5 microns, beneath an overlying silicon body of about 0.1–0.2 microns. One preferred method provides for a sequence of implant doses ranging from about 150 keV to about 200 keV.

The implantation temperature chosen also will depend on the desired characteristics of the SIMOX device. Generally, a minimum temperature of at least about 500° C. is required to ensure recrystallization of lattice damage in the overlying silicon body (self-annealing). Higher implantation temperatures (e.g., in the range of about 600°–750° C.) are preferred.

The annealing protocol chosen also will depend on the desired characteristics of the ultimate SIMOX device. Annealing temperatures ranging from about 1100° C. to just below the melting temperature of silicon, (1405° C.) are known in the art (see, for example, U.S. Pat. No. 4,824,698 to Lubomir et al.). A currently preferred protocol is annealing at 1300°–1350° C. for six hours. While annealing at higher temperatures may allow shorter annealing protocols, temperatures approaching the melting point of silicon are generally not considered practical for production grade devices, due to the difficulty in maintaining the integrity of the silicon lattice at such high temperatures.

Buried oxide layers produced by the method of this invention yield SIMOX substrates of superior quality, with a buried dielectric layer substantially free of silicon islands, and without increasing the manufacturing time of the substrate or the ion dose required.

DETAILED DESCRIPTION

Figure 1A:
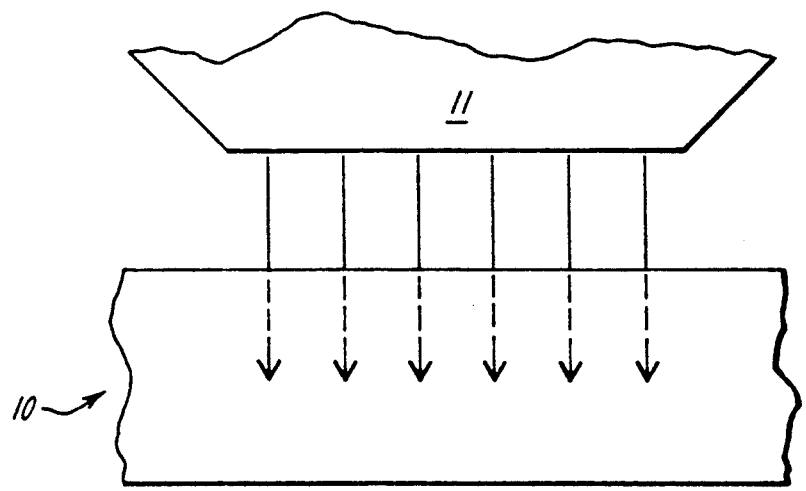
FIGS. 1A and 1B are schematic representations of a SIMOX device during ion implantation (A), and after annealing at a high temperature (B).
Figure 1B:
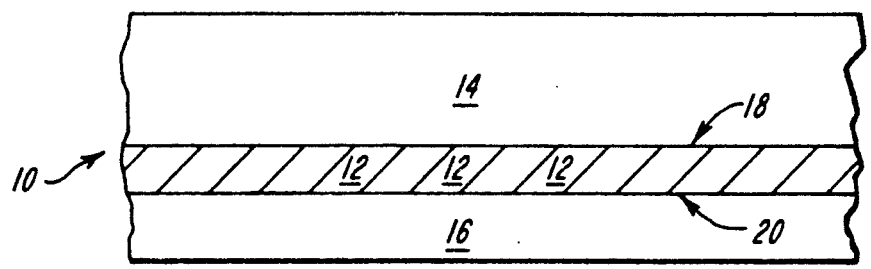

FIG. 1 is a schematic representation of a semiconductor substrate of this invention. In FIG. 1A, a single crystal silicon (Si) wafer 10, heated to an appropriate temperature, is exposed to an oxygen ion beam or beams 11 of sufficient energy such that the ions are embedded in the wafer. The wafer then is subjected to a high temperature annealing protocol (FIG. 1B) which redistributes the implanted free oxygen and chemically bonds it to silicon to form a continuous buried layer of silicon dioxide ($SiO_2$) 12, thereby separating the overlying silicon body 14, on the surface of which the semiconductor device is to be manufactured, from the remaining bulk silicon region 16 below. The upper Si/$SiO_2$ interface 18, and the lower $SiO_2$/Si interface 20 are both sharp.

It has been discovered that the use of an increasing ion beam energy produces a buried oxide layer that is free of silicon islands. Increasing the beam energy throughout the implant process increases the concentration of ions implanted near the lower interface. Without being limited to any one theory, it is believed that, upon high temperature annealing, free ions in the silicon layers migrate toward the buried oxide layer, which may act as a sink. In the SIMOX devices of the art the lower ion density at the interfaces, particularly the lower interface, may cause formation of a ragged boundary, resulting in silicon island formation as ions migrate into the dielectric layer. By providing a high density of oxygen ions at the lower interface, it is possible to obtain a sharp boundary at this interface, preventing the formation of silicon islands.

In the method of this invention, the ion beam energy is increased throughout the implantation process. The beam energy may be increased continuously or it may be increased in separate, discrete increments. The ion beam energy levels may range from about 100 to 400 keV. Currently preferred energy levels range from about 100–200 keV.

The implantation temperature should be sufficient to allow self-annealing of the damaged lattice in the overlying silicon body, preferably in the range of 600°–750° C. The dose of oxygen ions implanted at each ion beam energy is a subcritical dose and may be held constant for each beam energy, or it may be varied. The total ion dose implanted may range from about 0.5 to $3.0 \times 10^{18}$ ions/cm². Currently preferred doses are in the range of about $1.5 \times 10^{18}$ ions cm².

Annealing protocols should be sufficient to allow free oxygen to redistribute and chemically bond to form silicon dioxide. A currently preferred protocol is to anneal at a temperature of 1300°–1350° C. for six hours.

A particular embodiment of the invention is described below to illustrate the method of the invention. However, it should be clear that various changes, additions and subtractions can be made by those skilled in the art without departing from the spirit or scope of the invention. For example, although the invention is described in the context of creating a buried oxide layer in a silicon substrate, the teachings of the invention also can be applied to other semiconductor substrates. Likewise, other implanted ions can be used, such as, for example, nitrogen ions to produce buried nitride layers.

EXAMPLE

In this example, device grade single crystal (100) silicon wafers are implanted with oxygen ions at a total density of $1.5 \times 10^{18}$ ions/cm². The oxygen ions are implanted in five discrete subdoses of $0.3 \times 10^{18}$ ions/cm² and increasing ion beam energies from 150 keV to 200 keV. The particular sequence and energies used in this example are indicated below in Table 1.

TABLE I

| E (keV) | Dose ($\times 10^{18}$) ions/cm² |
| --- | --- |
| 150.0 | 0.3 |
| 167.5 | 0.3 |
| 175.0 | 0.3 |
| 187.5 | 0.3 |
| 200.0 | 0.3 |

The wafer was preheated to 600° C., and maintained at this temperature throughout the implant protocol. Oxygen ions were implanted using a multiple beam apparatus such as is described in U.S. patent application Ser. No. 487,597, filed Mar. 1, 1990, the disclosure of which is hereby incorporated by reference. Alternatively, single beam implantation systems such as are known in the art can be used to implant the oxygen ions. However, the reduced current beam densities afforded by the multiple beam device substantially reduces the number of problems associated with the use of single beam systems of the art (e.g., static charge build-up).

In this example, the implantation time at each ion beam energy was held constant (approximately 60 minutes, although in other embodiments of the invention this time may be varied. Similarly, while the dose implanted at each ion beam energy was held constant in this example, it too may be varied.

Upon completion of the implant protocol, the specimen was annealed at 1300° C. for six hours in an atmosphere of 99.5% argon and 0.5% oxygen.

The final structure of the buried oxide layer is depleted in silicon islands throughout the dielectric layer and particularly at the lower interface, and the interfaces separating the oxide layer from the overlying and underlying silicon are sharp. In addition, the defect density in the single crystal overlying silicon body is less than about $10^4$ defects per square centimeter.

The method of the present invention is a cost-effective method of producing SIMOX substrates of superior quality which ar substantially free of silicon islands. The entire protocol takes less than 12 hours to complete. Moreover, by providing a higher concentration of oxygen ions at the lower interface, a particular oxide thickness may be formed, substantially free of silicon islands, using a lower dose of ions (e.g., about 15-20% lower).

What is claimed is:

1. A method of producing a buried insulating layer in a silicon substrate comprising the steps of:
    implanting oxygen ions into a silicon substrate in a single implant sequence to form an implant layer, wherein the implantation energy of said oxygen ions increases throughout said implant sequence such that the implanted ions are concentrated at a lower interface between the implant layer and the underlaying substrate to retard integration of silicon ions into the implant layer during subsequent annealing; and
    annealing said substrate to form a buried layer of $SiO_2$ in said silicon wafer, said buried layer lying between a overlying silicon body and an underlying bulk silicon region, and said buried layer being substantially free of silicon islands.

2. The method of claim 1 wherein the dose of oxygen ions implanted at each ion beam energy is a constant subcritical dose.

3. The method of claim 1 wherein the implantation energy of said oxygen ions increases from about 100 keV to about 400 keV during said sequence.

4. The method of claim 3 wherein the implantation energy of said oxygen ions increases about 150 keV to about 200 keV during said sequence.

5. The method of claim 1 wherein the implantation energy of said oxygen ions increases in multiple discrete increments.

6. The method of claim 1 wherein the implantation energy of said oxygen ions increases in a continuous sequence.

7. The method of claim 1 wherein said substrate is annealed at a temperature within the range of about 1100° C. to 1400° C.

8. The method of claim 7 wherein said substrate is annealed at a temperature within the range of about 1300° C. to 1375° C.

* * * * *